United States Patent
Desai et al.

(10) Patent No.: US 9,409,765 B1
(45) Date of Patent: Aug. 9, 2016

(54) METHOD AND APPARATUS FOR AN ISOLATING STRUCTURE

(71) Applicant: Maxim Integrated Products, Inc., San Jose, CA (US)

(72) Inventors: Hemant Desai, Gilbert, AZ (US); Viresh P. Patel, Austin, TX (US)

(73) Assignee: Maxim Integrated Products, Inc., San Jose, CA (US)

( * ) Notice: Subject to any disclaimer, the term of this patent is extended or adjusted under 35 U.S.C. 154(b) by 162 days.

(21) Appl. No.: 13/757,307

(22) Filed: Feb. 1, 2013

(51) Int. Cl.
  *H01L 29/84* (2006.01)
  *H01L 21/52* (2006.01)
  *B81B 7/00* (2006.01)

(52) U.S. Cl.
  CPC ................... *B81B 7/0058* (2013.01)

(58) Field of Classification Search
  CPC ....... H01L 21/50; H01L 29/84; H01L 41/053; H01L 21/52
  See application file for complete search history.

(56) References Cited

U.S. PATENT DOCUMENTS

| 2007/0013052 | A1* | 1/2007 | Zhe et al. | 257/704 |
|---|---|---|---|---|
| 2007/0040231 | A1* | 2/2007 | Harney et al. | 257/415 |
| 2008/0290430 | A1* | 11/2008 | Mahadevan et al. | 257/418 |
| 2010/0192689 | A1* | 8/2010 | Ulm | B81B 7/0012 73/430 |
| 2012/0126347 | A1* | 5/2012 | Yang et al. | 257/416 |
| 2012/0237073 | A1* | 9/2012 | Goida et al. | 381/361 |
| 2012/0319256 | A1* | 12/2012 | Lo et al. | 257/666 |
| 2013/0140655 | A1* | 6/2013 | Yeh et al. | 257/416 |
| 2013/0241045 | A1* | 9/2013 | Goida et al. | 257/704 |
| 2015/0023523 | A1* | 1/2015 | Elian et al. | 381/91 |

* cited by examiner

*Primary Examiner* — Tan N Tran
*Assistant Examiner* — Fazli Erdem
(74) *Attorney, Agent, or Firm* — North Weber & Baugh LLP

(57) ABSTRACT

The present invention relates to a method and apparatus for an isolating structure. Embodiments of the present invention provide a robust packaging process and a mechanical filter to reduce the mechanical shock from impact. The mechanical filter can be integrated within the package substrate as part of the packaging process, reducing the assembly complexity.

17 Claims, 8 Drawing Sheets

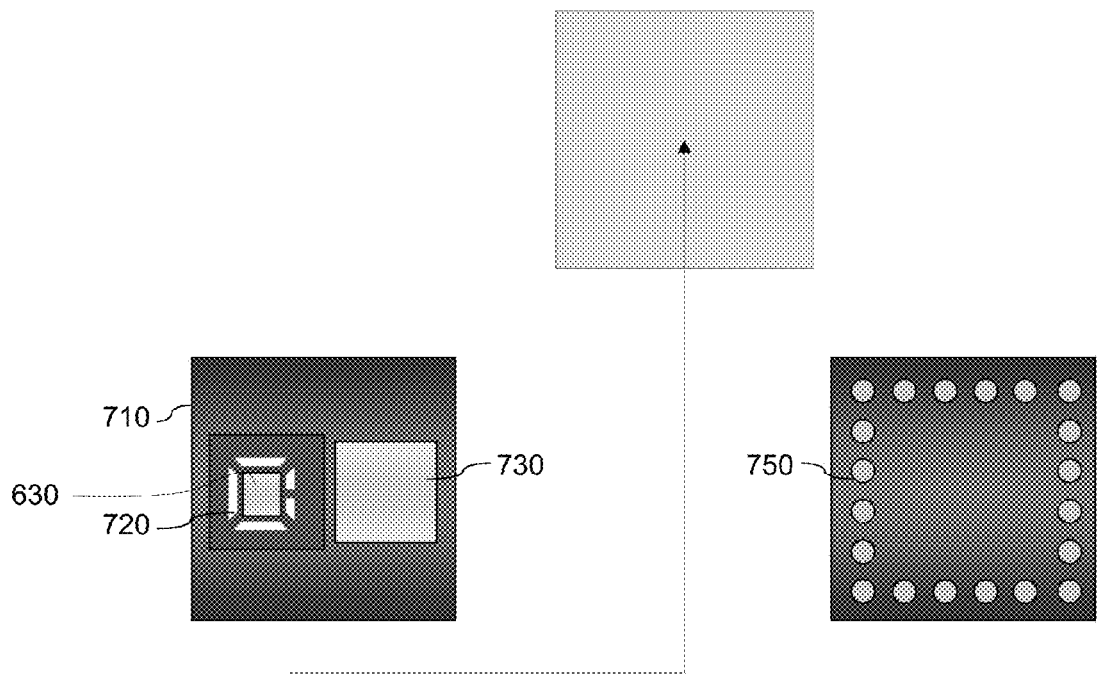
Figure 7A
Figure 7B
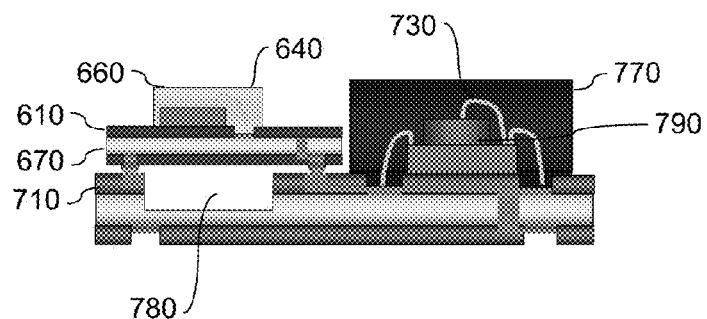
Figure 7C

METHOD AND APPARATUS FOR AN ISOLATING STRUCTURE

BACKGROUND

A. Technical Field

This invention relates generally to semiconductor manufacturing and packaging and more specifically to semiconductor manufacturing in MEMS (Microelectromechanical systems) sensing products.

B. Background of the Invention

MEMS sensing products can fail as a result of stresses and external mechanical shock such as rock impingement. For critical applications this can have catastrophic consequences. One field for which the consequences are catastrophic is in the field of automotive stability control, automotive air bag systems is another field and engine pressure management is yet another field for which consequences are catastrophic.

Automobiles use an inertial sensing device or a gyroscope device to assist in stability control and roll-over detection. The proper operation of the gyroscopic device is critical to the safety of the passengers of the automobile in order to detect a potentially dangerous condition, such as loss of control or roll-over. The gyroscope device normally is under a car within a housing. The location of the gyroscope device makes it particularly prone to impact by debris from the road. Even within the housing a rock, pebble or other road debris can impact the housing of the gyroscopic device and impair its operation.

Under normal conditions, the gyroscope has a drive mass that operates at a high frequency (typically approximately 10-50 KHz). The control of this frequency is critical in achieving the sensitivity specification and therefore this frequency is controlled by a closed loop system. When a pebble or rock strikes the gyroscope housing, it may generate a shock frequency that is at a resonant mode of the gyroscope system. This impact will then cause the drive mass to touch the substrate resulting in a loss of lock on the drive signal. This impact causes a brief failure of the gyroscope device. However, that brief failure can occur at a critical time and by the time the gyroscope device has recovered the vehicle could have already rolled over.

Unfortunately, the functioning of the gyroscope device is even more critical on road surfaces with a lot of debris, for example a dirt road or a road covered in pebbles. On those types of surfaces there are more likely to be stability control or roll-over issues. Also, those surfaces are more prone to impact and thus failure of the gyroscopic device.

In summary, what is needed is a way to prevent the gyroscopic device from failing due to impact.

SUMMARY OF THE INVENTION

Embodiments of the present invention provide a robust packaging process and a mechanical filter to reduce the mechanical shock from impact. The mechanical filter can be integrated within the package substrate as part of the packaging process, reducing the assembly complexity.

In one embodiment, the mechanical filter is implemented by etching a copper frame. The etching causes the copper frame to have a first portion and a second portion that can move relative to each other creating a spring type apparatus. The spring apparatus acts as a mechanical filter to reduce the mechanical shock from impact. The spring can be in any shape and size, and can be designed specifically to reduce mechanical shock at the particular resonant modes of the gyroscope device.

In one embodiment, the copper frame is mounted to a printed circuit board (PCB). The PCB can house the inertial sensing device or other device. In one embodiment, the PCB is mounted to the copper frame leaving a cavity or gap so that the first and second portions of the copper frame can move relative to each other.

In another embodiment, a molded and routed (MAR) device is used. The MAR device is routed such that the MAR device forms two portions that can move relative to each other. Thus, the MAR device itself creates a spring apparatus and provides the mechanical filtering to reduce mechanical shock from impact.

Other objects and attainments together with a fuller understanding of the invention will become apparent and appreciated by referring to the following description and claims taken in conjunction with the accompanying drawings.

BRIEF DESCRIPTION OF THE DRAWINGS

Reference will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

FIG. 7A shows a top view of an assembled MAR device, in accordance with various aspects of the present invention.

FIG. 7B shows a bottom view of an assembled MAR device, in accordance with various aspects of the present invention.

FIG. 7C shows a side view of an assembled MAR device, in accordance with various aspects of the present invention.

DETAILED DESCRIPTION OF THE PREFERRED EMBODIMENTS

The following description is set forth for purpose of explanation in order to provide an understanding of the invention. However, it is apparent that one skilled in the art will recognize that embodiments of the present invention, some of which are described below, may be incorporated into a number of different systems and devices. The embodiments of the present invention may be present in hardware, software or firmware. Structures shown below in the diagram are illustrative of exemplary embodiments of the invention and are meant to avoid obscuring the invention. Furthermore, connections between components within the figures are not intended to be limited to direct connections. Rather, data between these components may be modified, re-formatted or otherwise changed by intermediary components.

Reference in the specification to "one embodiment", "in one embodiment" or "an embodiment" etc. means that a particular feature, structure, characteristic, or function described in connection with the embodiment is included in at least one embodiment of the invention. The appearances of the phrase "in one embodiment" in various places in the specification are not necessarily all referring to the same embodiment.

Figure 1:
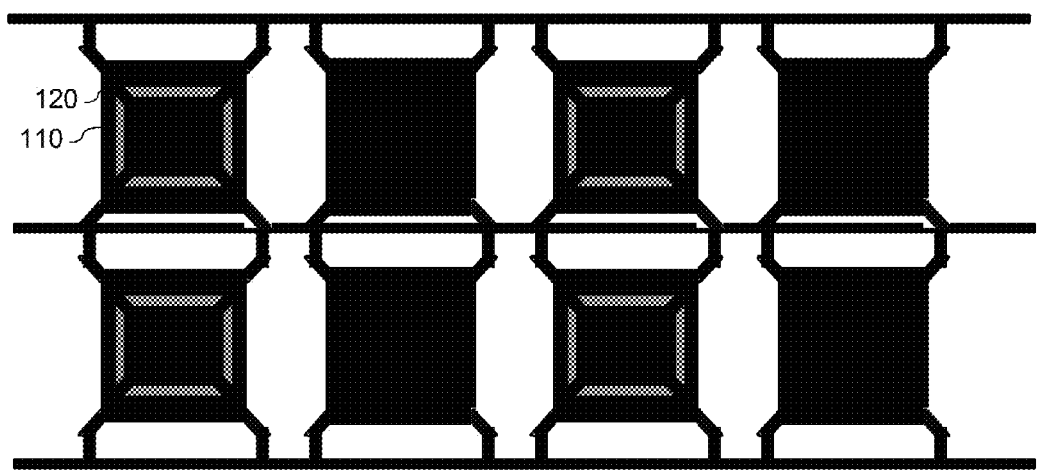
FIG. 1 shows a top view of a copper frame including etching, in accordance with various aspects of the present invention.

FIG. 1 shows a top view of a copper frame including etching, in accordance with various aspects of the present invention. The embodiment in FIG. 1 shows a copper frame 110 with etching 120. The etching 120 divides the copper frame 110 into two portions that can move relative to each other, acting like a spring. Etching 120 can be in any shape and size. In one embodiment the shape and size of the etching is designed to have a particular spring constant, k, to reduce the effects of impact at a resonant frequency to the payload device, e.g., an inertial sensing device or MEMS device.

The etched copper frame 110 provides mechanical isolation for a MEMS device which can be mounted to the etched copper frame 110. In the example of an automobile and an inertial sensing device, the mechanical isolation can prevent failure of the inertial sensing device caused by shock of impact from road debris.

Figure 2:
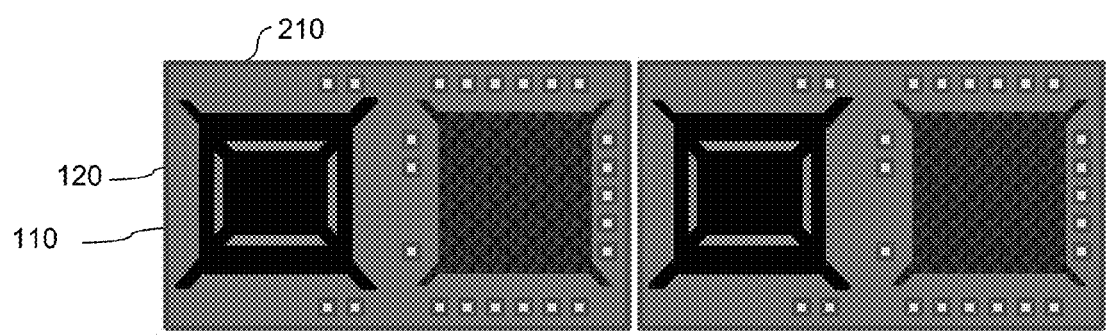
FIG. 2 shows a top view of a copper frame mounted to a PCB, in accordance with various aspects of the present invention.

FIG. 2 shows a top view of a copper frame mounted to a PCB, in accordance with various aspects of the present invention. FIG. 2 shows the copper frame 110 with integrated mechanical filter shown in FIG. 1 superimposed on PCB 210. In one embodiment the mechanical filter is integrated into the substrate. The assembly process flow for die attach and wire bond takes place prior to integrating the filter into the substrate. This will allow robust support for die attach and die to die wire bond for die in the filter area making it easier in the assembly process. One advantage of the present invention is the ability to manufacture the present invention without damaging the filter and with high yield rates. A further advantage of the present invention is that the mechanical filter can be implemented with relatively low cost. Yet a further advantage of the present invention is the mechanical isolation provided.

Figure 3:
FIG. 3 shows a side view of a copper frame mounted to a PCB, in accordance with various aspects of the present invention.

FIG. 3 shows a side view of a copper frame mounted to a PCB, in accordance with various aspects of the present invention. FIG. 3 shows copper frame 110 mounted on PCB 210. FIG. 3 also shows cavity or gap 310. Cavity 310 is of particular importance because it permits the spring formed as a result of the etching shown in FIG. 1 to function. The gap 310 allows space for the two portions of the copper frame 110 to move relative to each other.

Figure 4:
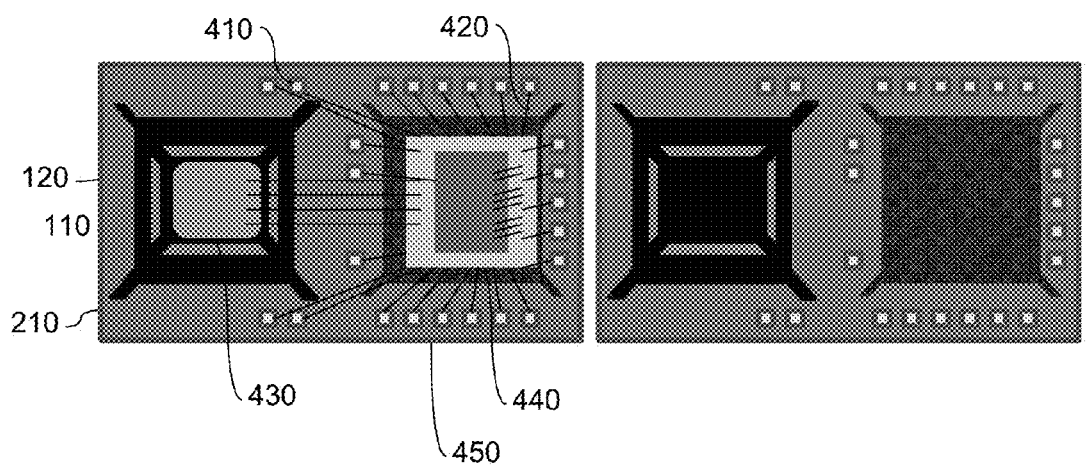
FIG. 4 shows a top view of a copper frame mounted to a PCB including wire bonding, in accordance with various aspects of the present invention.

FIG. 4 shows a top view of a copper frame mounted to a PCB including wire bonding, in accordance with various aspects of the present invention. FIG. 4 shows copper frame 110 with etching 120 mounted on PCB 210, providing the same benefits as the apparatus shown in FIG. 3. The embodiment shown in FIG. 4 also includes a gyroscopic device 430, an Application Specific Integrated Circuit (ASIC) 450 and an accelerometer 440. FIG. 4 also shows the wire bonding 420. In the embodiment shown in FIG. 4, the wire length is shortened so that the failure due to wire fatigue is reduced. In this embodiment, the cost of overall packaging is reduced as well by processing this package in a matrix panel format versus single row strip format.

Figure 5:
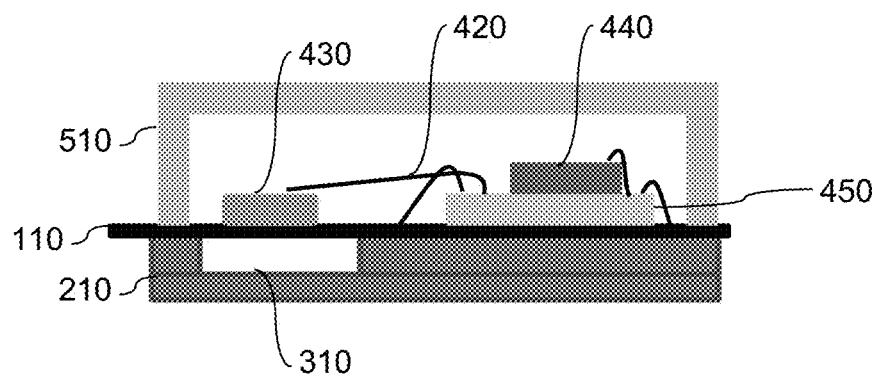
FIG. 5 shows a side view of a copper frame mounted to a PCB including wire bonding, in accordance with various aspects of the present invention.

FIG. 5 shows a side view of a copper frame mounted to a PCB including wire bonding, in accordance with various aspects of the present invention. FIG. 5 shows copper frame 110 mounted on PCB 210 including cavity 310. Similar to FIG. 4, FIG. 5 also shows a gyroscopic device 430, an ASIC 450, and accelerometer 440. FIG. 5 also illustrates the shortened wire lengths 420 with less fatigue on the wire. FIG. 5 also shows a lid 510. The lid 510 can be made from any suitable material, e.g., metal ceramic, plastic, etc.

Figure 6A:
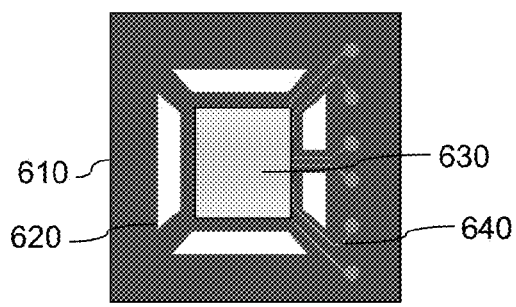
FIG. 6A shows a top view of a MAR device, in accordance with various aspects of the present invention.
Figure 6B:
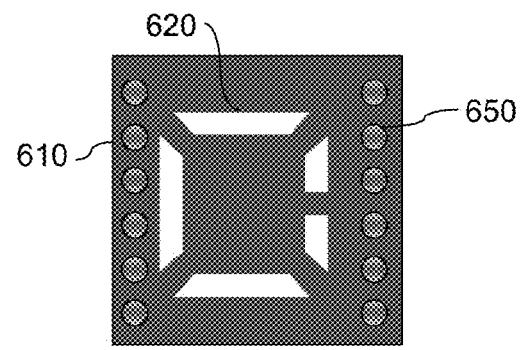
FIG. 6B shows a bottom view of a MAR device, in accordance with various aspects of the present invention.
Figure 6C:
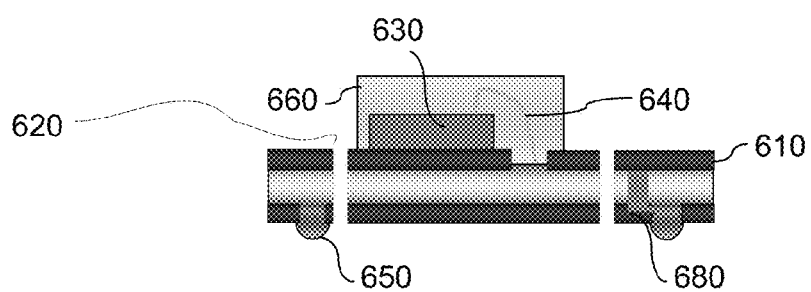
FIG. 6C shows a side view of a MAR device, in accordance with various aspects of the present invention.

FIG. 6A shows a top view of a MAR device, in accordance with various aspects of the present invention. The embodiment shown in FIGS. 6A-6C and 7A-7C is a package on package (PoP) solution. FIGS. 6A-6C show the one step in the PoP embodiment, building the sensor on a mechanical filter. FIGS. 7A-7C show another step in the PoP embodiment, finishing the package with the other assembly and sensor package.

The embodiment shown in FIGS. 6A, 6B, and 6C show different views of a MAR device 610. The MAR device includes a spring like feature 620 for performing mechanical isolation. FIG. 6A also shows wires 640 and sensor die 630.

In this embodiment, the sensor die 630, wire bond 640, and the mechanical filter 620 is isolated and packaged separately to truly gain the isolation benefit. In this embodiment, the wire fatigue potential is avoided since both ends of the wire bond are within the mechanical filter instead of on opposite sides of the filter. In this embodiment, the cost of overall packaging is reduced as well by processing this package in a matrix panel format versus single row strip format.

This embodiment has the further advantage that both ends of the wire are attached on the same side of the mechanical isolation. Therefore, wire fatigue is reduced and manufacturing yield is increased.

FIG. 6B shows the bottom side of the MAR device 610 and a spring like feature 620 and interconnects, e.g. solder balls 650.

FIG. 6C shows a side view of a MAR device, in accordance with various aspects of the present invention such as the wire bonding on the mechanical filter platform 640, the device and wire bond in a lid or molded 660, the mechanical isolation feature 620, wire bond to bottom contact 680 and the bottom contacts 650.

The embodiment shown in FIGS. 7A, 7B, and 7C show different views of a fully assembled package utilizing the MAR device 710. FIG. 7A shows ASIC 730, a spring like feature 720 for performing mechanical isolation, and a MEMS die 630, on top of the isolation feature in accordance with various aspects of the present invention. FIG. 7B shows the bottom view of an assembled package utilizing a MAR device; the contacts can be configured as needed following normal packaging requirements and capabilities.

FIG. 7C shows a side view of a MAR device assembled in the final package, in accordance with various aspects of the present invention. FIG. 7C also shows the cavity 780 in the package allowing for the motion of the spring isolated structure of the MAR device 610. FIG. 7C also shows additional devices assembled on the final package, such as ASIC, memory chips 790 and their wire bonds 730 and their lid or molding 770.

Figure 8:
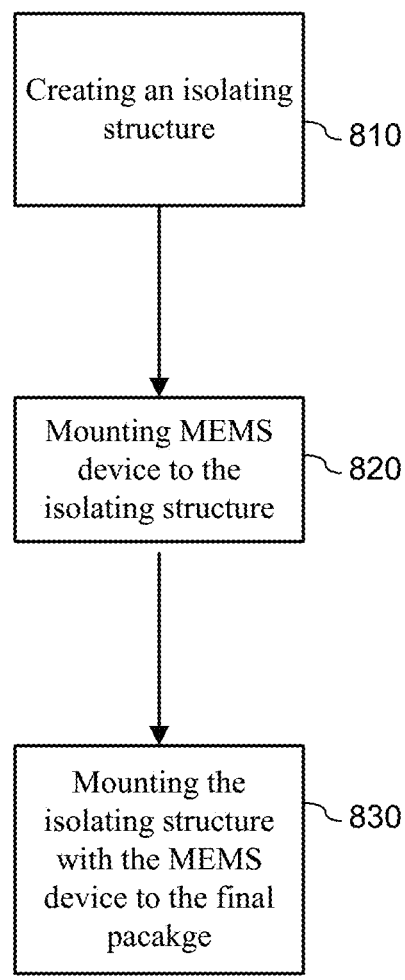
FIG. 8 shows a flowchart of a method for mechanical isolation, in accordance with various aspects of the present invention.

FIG. 8 shows a flowchart of a method for mechanical isolation, in accordance with various aspects of the present invention. FIG. 8 shows creating an isolating structure 810 and mounting a MEMS device to the isolating structure 820 and mounting the isolating structure with the MEMS device to the final package 830. In one embodiment, creating an isolating structure 810 can be accomplished by etching a copper frame to form a mechanical isolating structure as shown in FIG. 1. In another embodiment, creating an isolating structure can be accomplished using a MAR device as shown in FIGS. 6A-6C. In one embodiment mounting a MEMS device and the isolating structure to the final package 830 can be accomplished by mounting the etched copper frame to a PCB as shown in FIGS. 2-5. In another embodiment, mounting a MEMS device to the isolating structure can be accomplished by using a MAR device as shown in FIGS. 6A-6C and attaching it to the final package which maybe a PCB with cavity as shown in FIGS. 7A-7C. In one embodiment the MEMS device is an inertial sensing device.

While the invention has been described in conjunction with several specific embodiments, it is evident to those skilled in the art that many further alternatives, modifications and variations will be apparent in light of the foregoing description. Thus, the invention described herein is intended to embrace all such alternatives, modifications, applications, combinations, permutations, and variations as may fall within the spirit and scope of the appended claims.

We claim:

1. An apparatus for mechanical isolation in semiconductor packaging, comprising:
   a circuit board and an etched copper frame wherein the etching forms a first portion of the copper frame and a second portion of the copper frame, the etched copper frame coupled to the printed circuit board;
   a cavity between the printed circuit board and the etched copper frame permitting the first portion of the copper frame to move relative to the second portion of the copper frame; and
   a wire bond, both ends of the wire bond coupled to the first portion of the etched copper frame.

2. The apparatus of claim 1, wherein the etching forms a liner pattern.

3. The apparatus of claim 1, wherein the etched copper frame acts as a spring.

4. The apparatus of claim 3, wherein the etched copper frame has a particular spring constant computed to reduce the effects of vibration at the resonant frequency of the inertial sensing device.

5. The apparatus of claim 1, wherein the etched copper frame houses a microelectromechanical systems device.

6. The apparatus of claim 5, wherein the microelectromechanical systems device is an inertial sensing device.

7. The apparatus of claim 5, wherein the microelectromechanical systems device is a pressure sensing device.

8. An apparatus for mechanical isolation in semiconductor packaging, comprising:
   a first package on a second package, wherein the first package is a molded and routed package, the routing creating a mechanical isolation structure;
   the second package is coupled to the molded and routed package;
   a mechanical filter packaged separately from the second package; and
   a wire bond coupled to the mechanical filter such that both ends of the wire are bonded within the mechanical filter.

9. The apparatus of claim 8, wherein the routed mechanical package houses a microelectromechanical systems device on the mechanical isolation structure.

10. The apparatus of claim 8, wherein the first package is electrically and mechanically coupled to the second package.

11. The apparatus of claim 8, wherein the mechanical isolation is designed such that a resonant frequency of an inertial sensing device is avoided.

12. The apparatus of claim 9, wherein the microelectromechanical systems device is an inertial sensing device.

13. The apparatus of claim 9, wherein the microelectromechanical systems device is a pressure sensing device.

14. The apparatus of claim 9, wherein the microelectromechanical systems device is mounted on a printed circuit board.

15. The apparatus of claim 8, wherein the mechanical isolation structure is formed by etching or routing a substrate wherein the etching or routing forms a first portion of the package and a second portion of the package.

16. The apparatus of claim 8, wherein the molded and routed package forms a spring.

17. The apparatus of claim 16, further comprising designing the spring such that the resonant frequency of the microelectromechanical systems device is avoided.

* * * * *